(12) United States Patent
Lee

(10) Patent No.: US 9,583,201 B1
(45) Date of Patent: Feb. 28, 2017

(54) STORAGE DEVICE AND OPERATING METHOD THEREOF

(71) Applicant: SK hynix Inc., Incheon-si, Gyeonggi-do (KR)

(72) Inventor: Hee Youl Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/017,876

(22) Filed: Feb. 8, 2016

(30) Foreign Application Priority Data

Sep. 7, 2015 (KR) ........................ 10-2015-0126392

(51) Int. Cl.
- *G11C 16/10* (2006.01)
- *G11C 16/16* (2006.01)
- *G11C 16/34* (2006.01)

(52) U.S. Cl.
CPC ............... *G11C 16/16* (2013.01); *G11C 16/10* (2013.01); *G11C 16/3459* (2013.01)

(58) Field of Classification Search
CPC ................................ G11C 16/10; G11C 16/26
USPC ........................................ 365/185.12, 185.24
See application file for complete search history.

(56) References Cited

U.S. PATENT DOCUMENTS

| | | | |
|---|---|---|---|
| 3,771,125 A * | 11/1973 | Nagahori | G11B 20/1816 360/31 |
| 7,135,726 B2 * | 11/2006 | Endoh | H01L 29/792 257/296 |
| 7,187,590 B2 * | 3/2007 | Zous | G11C 16/0466 257/E29.306 |
| 7,916,548 B2 * | 3/2011 | Futatsuyama | G11C 16/344 365/185.18 |
| 8,050,086 B2 * | 11/2011 | Shalvi | G11C 16/26 365/185.02 |
| 8,300,463 B2 * | 10/2012 | Park | G11C 16/10 365/185.09 |
| 8,321,764 B2 * | 11/2012 | Bueb | G11C 29/52 365/185.09 |
| 8,730,752 B1 * | 5/2014 | Kamalanathan | G11C 13/0011 365/185.24 |
| 8,879,319 B1 * | 11/2014 | Cassuto | G11C 16/10 365/185.03 |
| 8,909,493 B2 * | 12/2014 | Avila | G11C 16/0483 365/185.11 |
| 8,971,109 B2 * | 3/2015 | Noh | G11C 11/5635 365/185.02 |
| 8,984,209 B2 * | 3/2015 | Miura | G06F 12/0246 711/103 |
| 9,244,627 B2 * | 1/2016 | Helmer | G06F 3/0652 |
| 9,336,868 B1 * | 5/2016 | Hollmer | G11C 13/0069 |
| 9,391,119 B2 * | 7/2016 | Chen | H01L 27/224 |
| 9,461,182 B2 * | 10/2016 | Sommer | H01L 27/115 |
| 2009/0070748 A1 * | 3/2009 | Lin | G06F 11/1441 717/130 |
| 2009/0138754 A1 * | 5/2009 | Edwards | G06F 9/4403 714/6.11 |

(Continued)

*Primary Examiner* — Michael Tran
(74) *Attorney, Agent, or Firm* — William Park & Associates Ltd.

(57) ABSTRACT

A storage device includes a main block including a plurality of sub-blocks, a peripheral circuit configured to perform a program operation, a read operation or an erase operation on the sub-blocks, and a control logic configured to control the peripheral circuit so that the erase operation of the sub-blocks is performed in a reverse order to an order of the program operation.

20 Claims, 17 Drawing Sheets

(56) References Cited

U.S. PATENT DOCUMENTS

| | | | |
|---|---|---|---|
| 2010/0161881 A1* | 6/2010 | Nagadomi | G06F 12/0246 711/103 |
| 2013/0163359 A1* | 6/2013 | Noh | G11C 11/5635 365/203 |
| 2013/0343129 A1* | 12/2013 | Wakchaure | G11C 16/10 365/185.17 |
| 2014/0247660 A1 | 9/2014 | Avila et al. | |

* cited by examiner

STORAGE DEVICE AND OPERATING METHOD THEREOF

CROSS-REFERENCE TO RELATED APPLICATION

The present application claims priority to Korean patent application number 10-2015-0126392 filed on Sep. 7, 2015, in the Korean Intellectual Property Office, the entire disclosure of which is incorporated by reference herein.

BACKGROUND

1. Technical Field

Various embodiments relate generally to a storage device and an operating method thereof and, more particularly, to a storage device including a three-dimensional (3D) memory cell array, and an operating method thereof.

2. Related Art

A memory system may include a memory device storing data therein and a memory controller controlling general operations of the memory device.

The memory device may include a plurality of storage devices. Each of the storage devices may include a three-dimensional (3D) memory cell array.

The 3D memory cell array may include a plurality of 3D main blocks. Each of the main blocks may include a plurality of vertical strings arranged in a vertical direction to a substrate. In addition, the storage device including the 3D memory cell array may include a peripheral circuit configured to perform a program, erase or read operation, and a control logic configured to control the peripheral circuit in response to the memory controller.

BRIEF SUMMARY

Various embodiments relate to a storage device capable of improving reliability and reducing a size thereof by dividing a main block into a plurality of sub-blocks and performing erase operations on the sub-blocks by considering an order in which program operations are performed on the sub-blocks, and an operating method thereof.

A storage device according to an embodiment may include a main block including a plurality of sub-blocks, a peripheral circuit configured to perform a program operation, a read operation or an erase operation on the sub-blocks, and a control logic configured to control the peripheral circuit so that the erase operation of the sub-blocks is performed in a reverse order to an order of the program operation.

A method of operating a storage device according to an embodiment may include programming sub-blocks included in a selected main block, and erasing the sub-blocks in a reverse order to an order of programming of the sub-blocks.

DETAILED DESCRIPTION

Hereinafter, various examples of embodiments will be described in detail with reference to the accompanying drawings. The figures are provided to allow those with ordinary skill in the art to understand the scope of embodiments of the disclosure. The present disclosure may, however, be embodied in different forms and should not be construed as limited to the embodiments set forth. Rather, these embodiments are provided so that this disclosure will be thorough and complete. In addition, the embodiments are provided to fully convey a scope of the disclosure to those skilled in the art.

Figure 1:
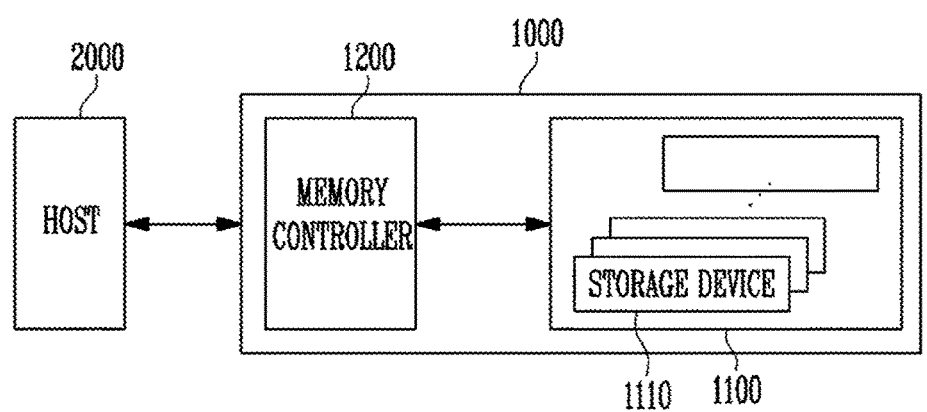
FIG. 1 illustrates a memory system according to an embodiment.

FIG. 1 illustrates a memory system according to an embodiment.

Referring to FIG. 1, a memory system 1000 may include a memory device 1100 storing data therein and a memory controller 1200 controlling the memory device 1100.

The memory device 1100 may include a plurality of storage devices 1110. The storage devices 1110 may include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR), Rambus Dynamic Random Access Memory (RDRAM), or FLASH Memory. The storage device 1110 composed of a NAND FLASH memory is described below.

The memory controller 1200 may control general operations of the memory device 1100. The memory controller 1200 may output commands, addresses and data to control the memory device 1100 to the memory device 1100, or receive data from the memory device 1100 in response to commands received from the host 2000.

The host 2000 may communicate with the memory system 1000 by using an interface protocol, such as Peripheral Component Interconnect-Express (PCI-E), Advanced Technology Attachment (ATA), Serial ATA (SATA), Parallel ATA (PATA), or serial attached SCSI (SAS).

Figure 2:
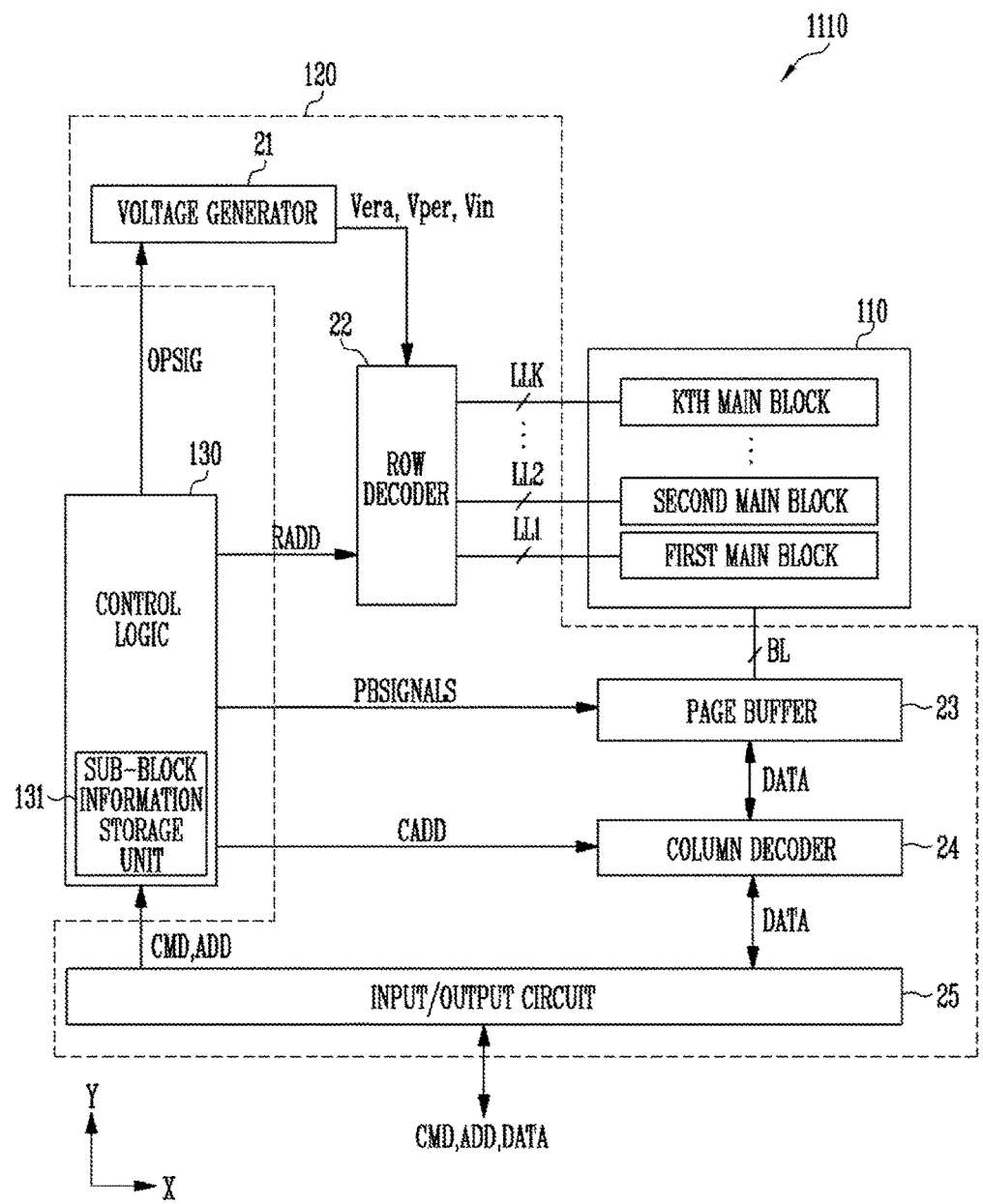
FIG. 2 illustrates a storage device included in FIG. 1.

FIG. 2 illustrates a storage device shown in FIG. 1.

Referring to FIG. 2, the storage device 1110 may include a memory cell array 110 storing data therein, a peripheral circuit 120 configured to perform a program operation, a read operation or an erase operation on sub-blocks of the memory cell array 110, and a control logic 130 configured to control the peripheral circuit 120.

The memory cell array 110 may include first to Kth main blocks having substantially the same configuration, where K is a positive integer. The first to Kth main blocks may have a three-dimensional (3D) structure. The first to Kth main blocks may be coupled to first to Kth local lines LL1 to LLK, respectively. In addition, each of the first to Kth main blocks may include a plurality of sub-blocks.

The peripheral circuit 120 may include a voltage generator 21, a row decoder 22, a page buffer 23, a column decoder 24 and an input/output circuit 25.

The voltage generator 21 may generate operating voltages having various voltage levels. The voltage generator 21 may generate the operating voltages in response to operation data OPSIG, and selectively apply the generated operating voltages to global lines. For example, the operation data OPSIG may include an operation signal and word line information (or word line group information). When receiving the operation data OPSIG, the voltage generator 21 may generate the operating voltages necessary to perform an erase operation. The operating voltages may include an erase voltage Vera, an erase permission voltage Vper and an erase inhibition voltage Vin. The voltage generator 21 may generate different operating voltages so that these operating voltages may be applied to a selected sub-block and an unselected sub-block included in a selected main block. For example, the voltage generator 21 may generate the erase permission voltage Vper for the selected sub-block and generate the erase inhibition voltage Vin for the unselected sub-block at the same time. The global lines may include global source lines, global source selection lines, global word lines and global drain selection lines.

The row decoder 22 may transfer an operating voltage Vop to local lines coupled to the selected main block, among the first to Kth local lines LL1 to LLK, in response to a row address RADD. For example, the row decoder 22 may be coupled to the voltage generator 21 through the global lines. The row decoder 22 may transfer operating voltages received through the global lines to local lines coupled to the selected main block. The row decoder 22 may transfer the operating voltages to only the word lines coupled to the selected main block. Therefore, the erase permission voltage Vper and the erase inhibition voltage Vin generated by the voltage generator 21 may be applied to only the selected sub-block and the unselected sub-blocks of the selected main block.

The page buffer 23 may be coupled to the memory cell array 110 through bit lines BL. The page buffer 23 may precharge the bit lines BL to a positive voltage, exchange data with the selected main block during program and read operations, or temporarily store the transferred data in response to a page buffer control signals PBSIGNALS. In addition, the page buffer 23 may measure a voltage or current in the bit lines BL during an erase operation of the selected sub-block.

The column decoder 24 may exchange data DATA with the page buffer 23 or exchange data DATA with the input/output circuit 25 in response to a column address CADD.

The input/output circuit 25 may be configured to transfer a command CMD and an address ADD, transferred from an external device (e.g., memory controller), to the control logic 130, transfer the data DATA transferred from the external device to the column decoder 24, or output data DATA transferred from the column decoder 24 to the external device.

The control logic 130 may control the peripheral circuit 120 in response to a command CMD and an address ADD. In addition, the control logic 130 may include a sub-block information storage unit 131 storing erase or program state information about sub-blocks included in the first to Kth main blocks. The control logic 130 may determine a sub-block which is not erased, among the sub-blocks included in the selected main block, based on information stored in the sub-block information storage unit 131 during the erase operation of the selected main block. As a result of the determination of the sub-block(s) which is not erased, the control logic 130 may control the peripheral circuit 120 to perform erase operations on the sub-block(s). For example, the sub-block information may include information about a sub-block in an erased state or information about a sub-block in a programmed state, among the sub-blocks included in the main block. When the information stored in the sub-block information storage unit 131 corresponds to information about sub-blocks in an erased state, the control logic 130 may control the peripheral circuit 120 so that erase operations may be performed on the sub-blocks sequentially from a sub-block subsequent to the sub-blocks in the erased state. When the information stored in the sub-block information storage unit 131 corresponds to information about the sub-blocks in the programmed state, the control logic 130 may control the peripheral circuit 120 so that erase operations may be performed on the sub-blocks sequentially from the first sub-block in an order of an erase operation, among the sub-blocks in the program state.

Figure 3:
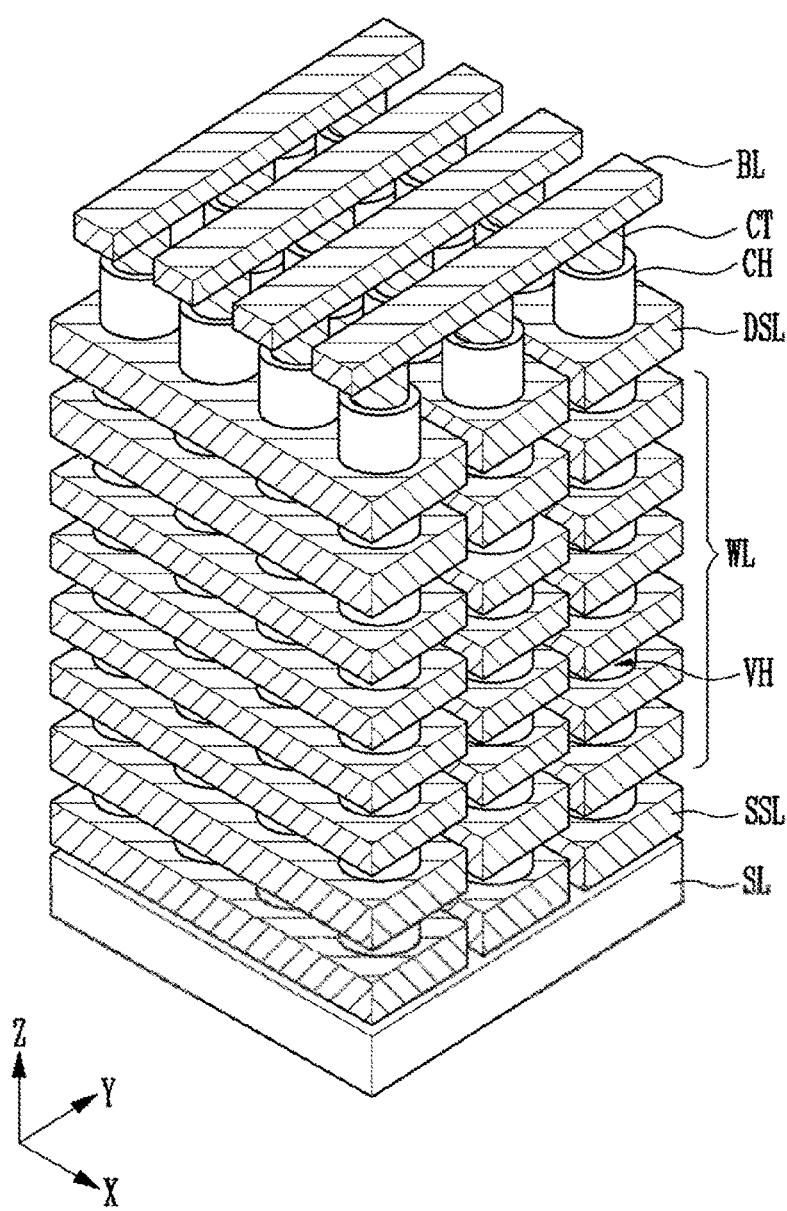
FIG. 3 is a perspective view illustrating an embodiment of a main block shown in FIG. 2.

FIG. 3 is a perspective view illustrating an embodiment of a main block shown in FIG. 2.

Since the first to Kth main blocks shown in FIG. 2 have substantially the same configuration, one of the main blocks is described in detail with reference to FIG. 3.

Referring to FIG. 3, a 3D structured main block may be arranged in a vertical direction (Z direction) relative to a substrate and include I-shaped vertical strings arranged between the bit lines BL and a source line SL. This structure may be referred to as Bit Cost Scalable (BiCS). For example, when the source line SL is formed in a horizontal direction relative to a top portion of the substrate, vertical strings having the BiCS structure may be formed vertically relative to the source line SL. More specifically, the vertical strings may include source selection lines SSL, word lines WL and drain selection lines DSL which are arranged in a first direction (Y direction), stacked and separated from each other. The vertical strings may also include vertical holes VH and vertical channel layers CH. The vertical holes VH may vertically pass through the source selection lines SSL, the word lines WL and the drain selection lines DSL. The vertical channel layers CH may be formed in the vertical holes VH and contact the source line SL. Source selection transistors may be formed between the vertical channel layers CH and the source selection lines SSL, memory cells may be formed between the vertical channel layers CH and the word lines WL, and the drain selection transistors may be formed between the vertical channel layers CH and the drain selection lines DSL.

The bit lines BL may contact top portions of the vertical channel layers CH which protrude above from the drain selection lines DSL and the bit lines BL may be arranged in a second direction (X direction) orthogonal to a first direction (Y direction). Contact plugs CT may be formed between the bit lines BL and the vertical channel layers CH.

Figure 4:
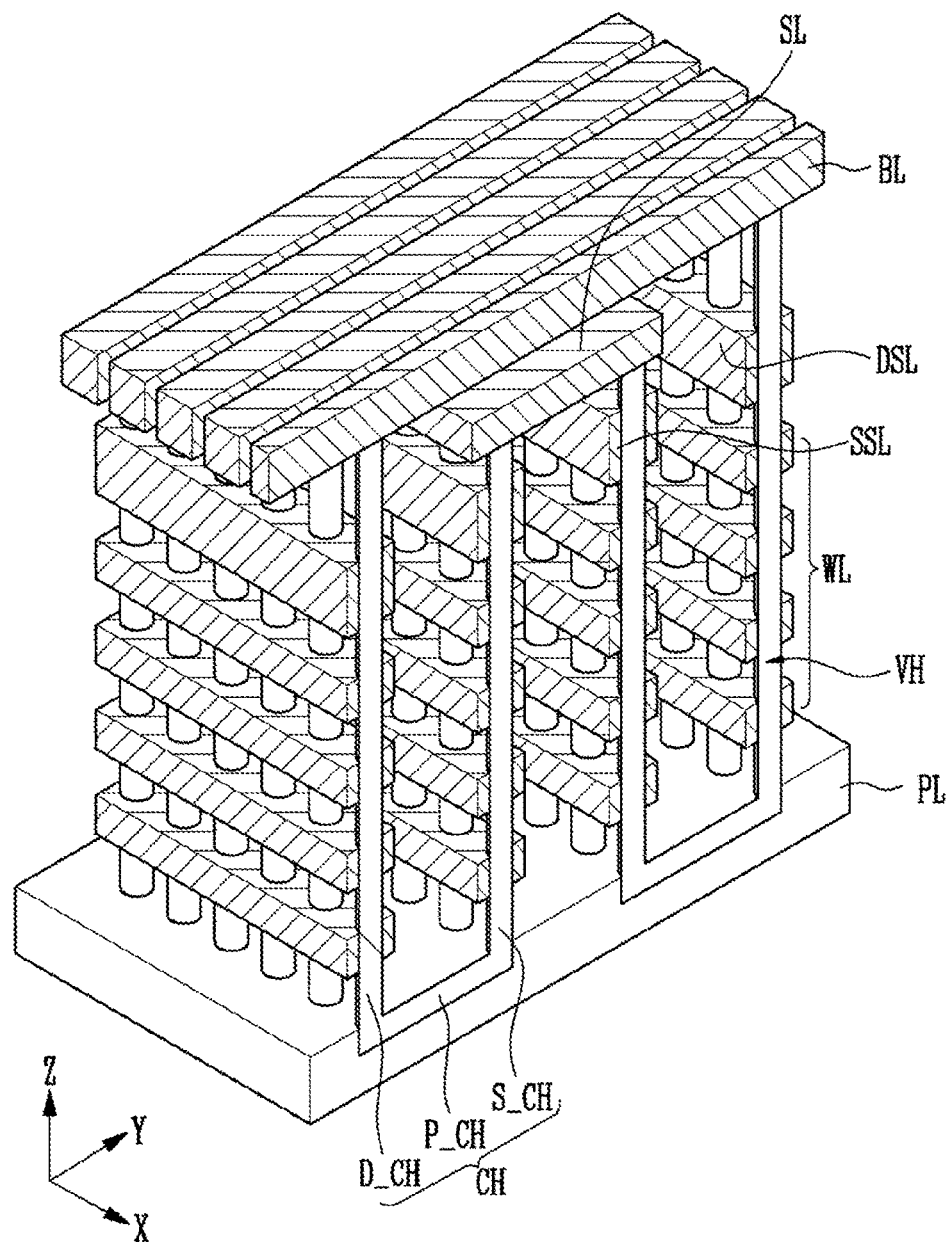
FIG. 4 is a perspective view illustrating another embodiment of a main block shown in FIG. 2.

FIG. 4 is a perspective view illustrating another embodiment of a main block shown in FIG. 2.

The first to Kth main blocks shown in FIG. 2 may have substantially the same configuration. Thus, only one of the main blocks is described in detail with reference to FIG. 4.

Referring to FIG. 4, a 3D main block may be formed in a vertical direction (Z direction) to a substrate and include vertical strings arranged between the bit lines BL, the source line SL and a pipe structure coupling the two strings.

More specifically, the vertical strings may include first sub-strings arranged in a vertical direction between the bit lines BL and a pipe line PL, and second sub-strings arranged in the vertical direction between the source line SL and the pipe line PL. The first and second sub-strings may each be connected to form a U shape in a pipe line PL region. This structure may be referred to as Pipe-shaped Bit Cost Scalable (P-BiCS).

For example, when the pipe line PL is formed in direction a horizontal to the top portion of the substrate, the first and second sub-strings may be formed in a vertical direction in relation to the top portion of the pipe line PL. The first sub-strings may be formed between the bit lines BL and the pipe line PL, and the second sub-strings may be formed between the source line SL and the pipe line PL.

More specifically, the first sub-strings may include the word lines WL, the drain selection lines DSL and first vertical channel layers D_CH. The word lines WL and the drain selection lines DSL may be separated from each other and arranged in a first direction (Y direction), extend in a second direction (X direction) vertical to the first direction (Y direction), and be stacked and separated from each other in a third direction (Z direction). The first vertical channel layers D_CH may be formed in the vertical holes VH passing through the word lines WL and the drain selection lines DSL in the vertical direction.

The second sub-strings may include the word lines WL, the source selection lines SSL and second vertical channel layers S_CH. The word lines WL and the source selection lines SSL may be separated from each other and arranged in the first direction (Y direction), extend in the second direction (X direction) vertical to the first direction (Y direction), and be stacked and separated from each other in a third direction (Z direction). The second vertical channel layers S_CH may be formed in the vertical holes VH passing through the word lines WL and the source selection lines SSL in the vertical direction. Memory cells may be formed between the first vertical channel layers D_CH and the word lines WL and between the second vertical channel layers S_CH and the word lines WL. Source selection transistors may be formed between the second vertical channel layers S_CH and the source selection lines SSL. The drain selection transistors may be formed between the first vertical channel layers D_CH and the drain selection lines DSL.

The first vertical channel layers D_CH and the second vertical channel layers S_CH may be coupled to each other through pipe channel layers P_CH in the pipe line PL. The bit lines BL may contact top portions of the first vertical channel layers D_CH which protrude above from top portions of the drain selection lines DSL, and the bit lines BL may be stacked and separated from each other in the second direction (X direction) perpendicular to the first direction (Y direction). The source line SL may contact top portions of the second vertical channel layers S_CH protruding above from the source selection lines SSL and extend in the second direction (X direction).

The first to Kth main blocks shown in FIG. 2 may have the 3D structure as shown in FIG. 3 or 4 and be divided into a plurality of sub-blocks into which a plurality of pages (a group of memory cells coupled to a word line) are grouped.

An erase operation performed on one of the above-described main blocks is described below.

Figure 5:
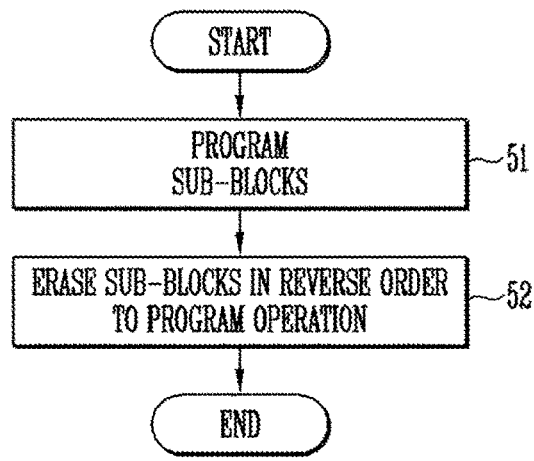
FIG. 5 is a flowchart illustrating an erase operation according to an embodiment.

FIG. 5 is a flowchart illustrating an erase operation according to an embodiment.

Referring to FIG. 5, an erase operation of a selected main block may be performed in sub-block units. A program operation on the selected main block may need to be performed in advance in units of sub-blocks. When a program operation of the selected main block starts, sub-blocks included in the selected main block may be sequentially or non-sequentially programmed (51). The program operation may be sequentially performed on the sub-blocks in a direction from the source selection line to the drain selection line, or in a direction from the drain selection line to the source selection line. For example, when sub-blocks are sequentially selected in the direction from the source selection line toward the drain selection line, and the program operation is performed thereon, pages may be programmed while the pages are sequentially selected in the direction from the source selection line to the drain selection line in a selected sub-block. On the other hand, when the sub-blocks are sequentially selected in the direction from the drain selection line toward the source selection line, and the program operation is performed thereon, the pages may be programmed while the pages are sequentially selected in the direction from the drain selection line to the source selection line in the selected sub-block. Alternatively, the program operation may be performed by non-sequentially selecting the sub-blocks and sequentially selecting pages in the selected sub-block. The term "non-sequentially" may refer to "randomly."

After the program operation of the selected main block is completed, when the erase operation of the selected main block is performed, the erase operation may be performed on the sub-blocks in the reverse order to the program operation order (52). When the program operation is performed in the direction from the source selection line to the drain selection line, the erase operation may be performed in a direction from the sub-block adjacent to the drain selection line to the sub-block adjacent to the source selection line. Erase operations may be performed at the same time on memory cells in the selected sub-block.

As described above, when the erase operation is performed in the reverse order as the program operation, changes in threshold voltage distribution between sub-blocks caused by different patterns may be prevented, and an increase in a width of the threshold voltage distribution may be prevented.

The above-described erase operation may be performed in units of sub-blocks. An operation time may be shortened by performing erase operations on only sub-blocks in a program state, except for previously erased sub-block(s), among the sub-blocks included in the selected main block. Whether a sub-block is in an erased state or a programmed state may be determined by using various methods. For example, to determine an erased/programmed state of a sub-block, the erased/programmed state information of the sub-block may be stored in the sub-block information storage unit 131 shown in FIG. 2. The control logic 130, shown in FIG. 2, may select a sub-block in a programmed state according to the erased/programmed state information of the sub-block stored in the sub-block information storage unit 131 shown in FIG. 2. On the other hand, when the control logic 130 does not include the sub-block information storage unit 131, the control logic 130 may sequentially verify the sub-blocks included in the selected main block to determine whether the sub-blocks are in the erased state or the programmed state. Since the states of the sub-blocks can be determined, flag cells for storing erased/programmed information of the sub-blocks may not be required in the main block. Therefore, the size of the storage device may be reduced.

Figure 6:
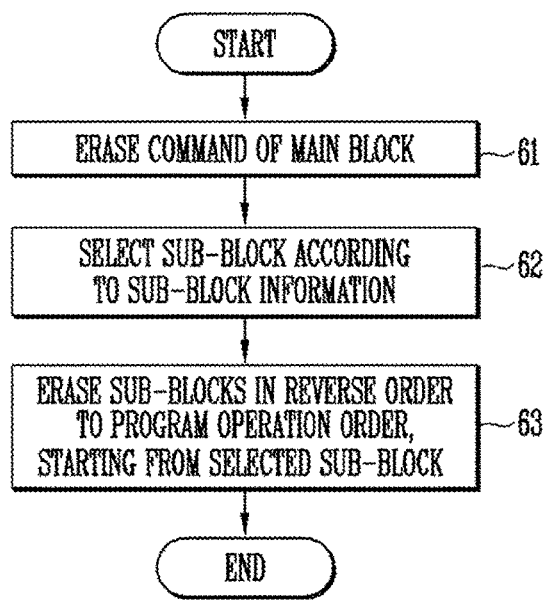
FIG. 6 is a flowchart illustrating an embodiment of an erase operation shown in FIG. 5.

FIG. 6 is a flowchart illustrating an embodiment of an erase operation shown in FIG. 5. Among the above methods of determining an erased/programmed state as described with reference to FIG. 5, an erase operation using information stored in the sub-block information storage unit 131 is described below.

Referring to FIGS. 2 and 6, when an erase command of a selected main block is input to the control logic 130 shown in FIG. 2 (61), the control logic 130 may select a programmed sub-block, among sub-blocks included in the selected main block, according to the sub-block information stored in the sub-block information storage unit 131 (62). For example, the sub-block information from among the sub-blocks included in the selected main block, may include information about word lines or information about a word line group included in the first sub-block in the program state according to an order of the erase operation.

The control logic 130 may control the peripheral circuit 120 so that erase operations may be performed on the sub-blocks sequentially from the selected sub-block in the reverse order to the order of the program operation order [claim 1, clause 3] (63). More specifically, the control logic 130 may include the sub-block information obtained from the sub-block information storage unit 131 in the operation data OPSIG, and transfer the operation data OPSIG to the voltage generator 21. The voltage generator 21 may generate voltages (e.g., an erase voltage, an erase permission voltage and an erase inhibition voltage) necessary to perform the erase operation in response to the operation data OPSIG, and the voltage generator 21 may selectively apply the generated voltages to the global lines. For example, the voltage generator 21 may apply the erase voltage Vera to the global source lines, the erase permission voltage Vper, shown in FIG. 2, to selected global word lines, and the erase inhibition voltage Vin, shown in FIG. 2, to unselected global word lines. The row decoder 22 may select a main block on which the erase operation is performed in response to the row address RADD, and transfer the voltages, applied to the global lines, to local lines coupled to the selected main block.

When the erase operation of the selected sub-block is completed, erase operations of sub-blocks in a program state, among the sub-blocks included in the selected main block, may be sequentially performed in the reverse order of the program order.

Figure 7:
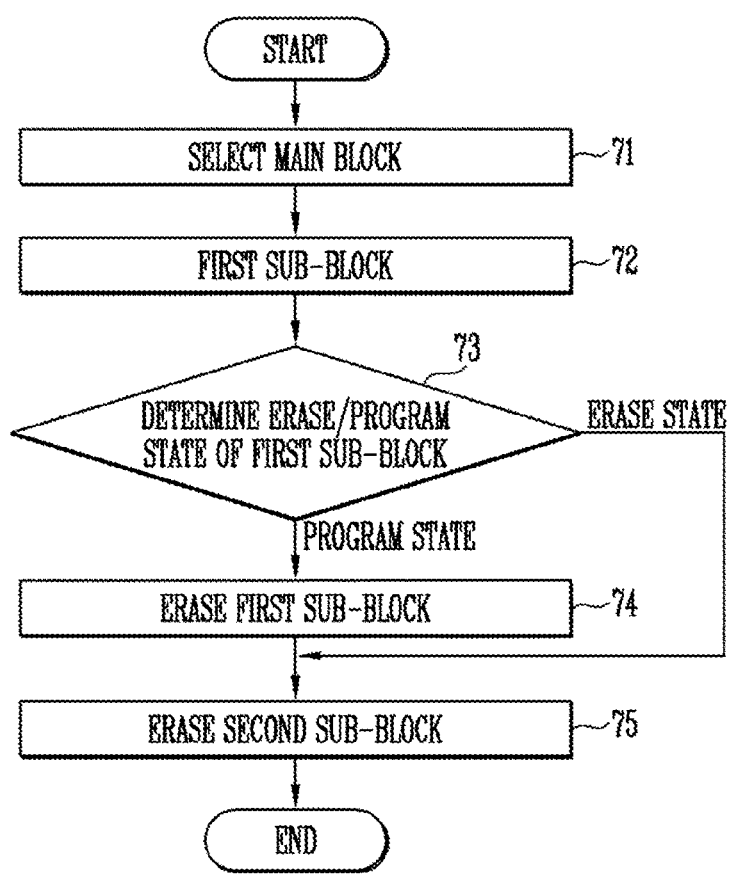
FIG. 7 is a flowchart illustrating another embodiment of an erase operation shown in FIG. 5.

FIG. 7 is a flowchart illustrating another embodiment of an erase operation shown in FIG. 5. Among the above methods of determining an erased/programmed state as described with reference to FIG. 5, an erase operation performed when sub-blocks are sequentially verified to determine an erased state or a programmed state thereof is described below.

Referring to FIGS. 2 and 7, when an erase command is input, a main block on which an erase operation is performed may be selected from among the first to Kth main blocks (71). The first sub-block, from among the sub-blocks included in the selected main block, may be selected (72). For example, when the first sub-block and the second sub-block are included in the selected main block, and the program operations are performed first on the second sub-block and then on the first sub-block, erase operations may be performed first on the first sub-block, on which the program operation is performed later, and then on the second sub-block.

Subsequently, an erased/programmed state of the first sub-block may be determined (73). A verify operation may be performed to determine the erased/programmed state of the first sub-block. For example, the verify operation may be determine that threshold voltages of all memory cells included in the first sub-block are lower than an erase verify voltage, or the verify operation may be determine whether the threshold voltages thereof are lower than a read voltage. The erase verify voltage may be set to a negative voltage, and a read voltage may be set to the lowest voltage, among read voltages. A verify operation using a voltage set between the erase verify voltage and the read voltage may be performed. When the erase verify voltage is used, the verify operation to determine the erased/programmed state may be performed on all pages included in the sub-block at the same time. When the read voltage is used, the verify operation to determine the erased/programmed state may be performed by selecting each page included in the sub-block.

The erase verify voltage may be set between −0.5V and +1V, and the read voltage may be set between −1V and a positive voltage. The positive voltage may be the lowest voltage in the threshold voltage distribution in the programmed state.

As a result of the verify operation, when the threshold voltages of all memory cells included in the first sub-block are lower than the erase verify voltage or lower than the read voltage, the first sub-block may be determined to be in an erased state. In other words, since the first sub-block is already erased, an erase operation of the second sub-block may be performed (75). At step 73, as a result of the verify operation, when the threshold voltages of all memory cells included in the first sub-block are greater than the erase verify voltage or greater than the read voltage, the first sub-block may be determined to be in a programmed state. Since the first sub-block is in the programmed state, an erase operation may be performed on the first sub-block (74). When the erase operation of the first sub-block is completed, an erase operation of the second sub-block may be performed. An erased/programmed state determining operation may not be performed on the second sub-block. In the selected main block, the second sub-block may be programmed first and the first sub-block may be programmed. Therefore, when the first sub-block is in the programmed state, it may be understood that the second sub-block is still in the programmed state.

Figure 8:
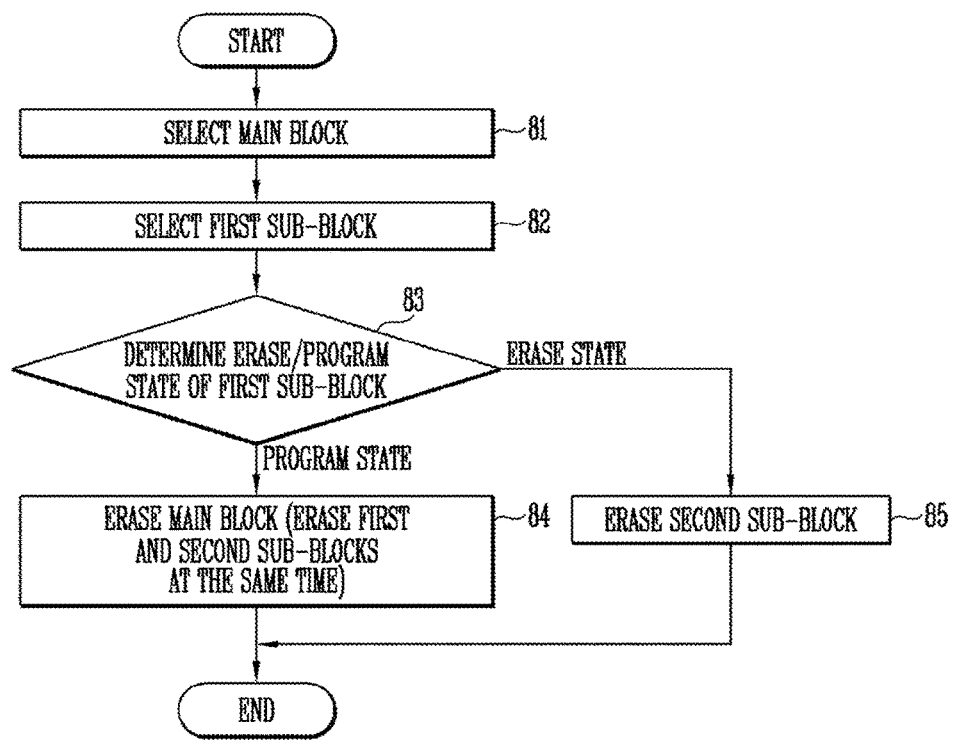
FIG. 8 is a flowchart illustrating another embodiment of an erase operation shown in FIG. 7.

FIG. 8 is a flowchart illustrating another embodiment of an erase operation shown in FIG. 7. An erase operation performed when a first sub-block is in a programmed state is described below.

Referring to FIGS. 2 and 8, when an erase command is input, a main block, among the first to Kth main blocks (81), on which an erase operation is performed may be selected and the first sub-block may be selected from among sub-blocks included in the selected main block (82). For example, when the selected main block includes the first sub-block and a second sub-block and program operations are sequentially performed first on the second sub-block and then on the first sub-block, erase operations may be performed first on the first sub-block, on which the program operation is first performed, and then on the second sub-block.

Subsequently, an erased/programmed state of the first sub-block may be determined (83). A verify operation may be performed to determine the erased/programmed state. For example, the erased/programmed state may be determined based on whether threshold voltages of all memory cells included in the first sub-block are lower than the erase verify voltage, or the erased/programmed state may be determined based on whether the threshold voltages thereof are lower than the read voltage.

As a result of the verify operation, when the threshold voltages of all memory cells included in the first sub-block are greater than the erase verify voltage or greater than the read voltage, the first sub-block may be determined to be in a programmed state. When the first sub-block is in the programmed state, all sub-blocks included in the selected main block may be in the programmed state. Therefore, an erase operation of the selected main block may be performed (84). To reduce the time to perform the erase operation, erase operations may be performed on the first and second sub-blocks at the same time, where the first and second sub-blocks are included in the selected main block.

At step 83, as the result of the verify operation, when the threshold voltages of all memory cells included in the first sub-block are less than the erase verify voltage or less than the read voltage, the first sub-block may be determined to be in the erased state. As a result, an erase operation of the second sub-block may be performed since the first sub-block is already erased (85).

Figure 9:
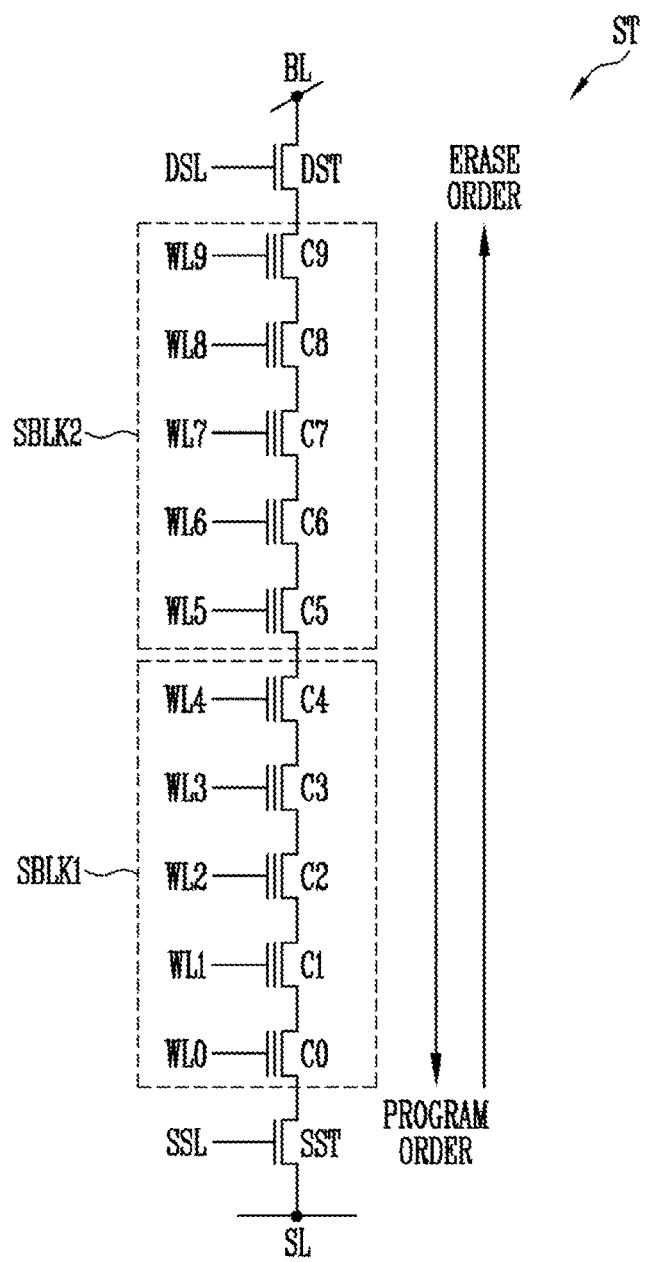
FIG. 9 is a circuit diagram configured to perform an erase operation according to an embodiment.

FIG. 9 is a circuit diagram for illustrating an erase operation according to an embodiment. An erase operation of a storage device including vertical strings having a BiCS structure is described below.

Referring to FIG. 9, in the vertical string having the BiCS structure, memory cells C0 to C9 may be arranged in a linear direction between the bit line BL and the source line SL, so that a first sub-block SBLK1 and a second sub-block SBLK2 may be included in the vertical string. The first sub-block SBLK1 and the second sub-block SBLK2 may be divided into upper and lower parts of the vertical string. The vertical string having the BiCS structure may include a source selection transistor SST, zeroth to ninth memory cells C0 to C9, a drain selection transistor DST and the bit line BL which are sequentially stacked on a top portion of the source line SL. A gate of the source selection transistor SST may be coupled to the source selection line SSL. Gates of the zeroth to ninth memory cells C0 to C9 may be coupled to zeroth to ninth word lines WL0 to WL9, respectively. A gate of the drain selection transistor DST may be coupled to the drain selection line DSL. For convenience of explanation, FIG. 9 briefly shows a vertical string. However, the number of source selection transistor SST, zeroth to ninth memory cells C0 to C9 and drain selection transistors DST may be increased according to the storage device.

When the program operation is performed in a direction from the drain selection transistor DST to the source selection transistor SST the erase operation may be performed in the reverse order to the order of the program operation. Thus, the erase operation may be performed in a direction from the source selection transistor SST to the drain selection transistor DST. The program operation may be performed in page units, whereas the erase operation may be performed in sub-blocks units. In other words, the erase operation may be performed first on the first sub-block SBLK1 adjacent to the source selection transistor SST, the erase operation may then be performed on the second sub-block SBLK2 adjacent to the drain selection transistor DST. However, when the first sub-block SBLK1 is determined to already be in the erase state, an erase operation of the second sub-block SBLK2 may be performed.

Figure 10:
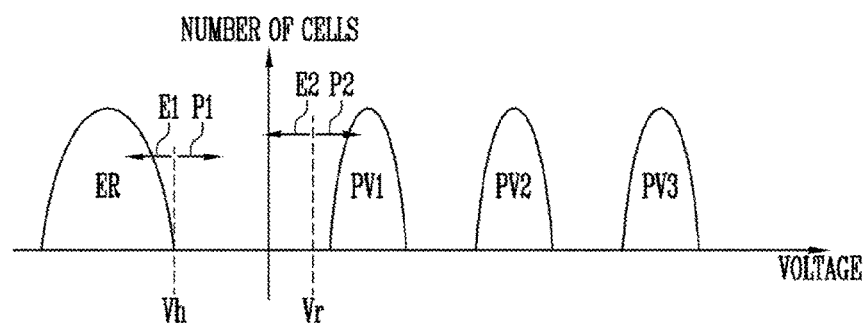
FIG. 10 illustrates a method of determining an erased/programmed state.

FIG. 10 illustrates a method of determining an erased/programmed state.

Referring to FIG. 10, when a verify operation is performed to determine an erased/programmed state of a sub-block, the verify operation may be performed using two methods as follows.

Firstly, a verify operation may be performed using a method of determining whether threshold voltages of memory cells included in the sub-block are lower than an erase verify voltage Vh. The erase verify voltage may be set between −0.5V and +1V. As a result of the verify operation using the erase verify voltage Vh, when threshold voltages of all memory cells are less than the erase verify voltage Vh (E1), the sub-block may be in the erase state ER. When a threshold voltage of at least one of the memory cells is greater than the erase verify voltage Vh (P1), some memory cells may be in a programmed state and an erase operation of the corresponding sub-block may be performed.

Secondly, a verify operation may be performed by a method of determining whether threshold voltages of memory cells included in the sub-block are less than a read voltage Vr. The read voltage may be set between −1V and a positive voltage, and the positive voltage may be the lowest voltage in a threshold voltage distribution in a programmed state. As a result of the verify operation using the read voltage Vr, when the threshold voltages of the memory cells are less than the read voltage Vr (E2), the sub-block may be determined to be in the erase state ER. When a threshold voltage of at least one of the memory cells is greater than the read voltage Vr (P2), some memory cells may be determined to be in the programmed state. Thus, an erase operation may be performed on the corresponding sub-block.

Figure 11:
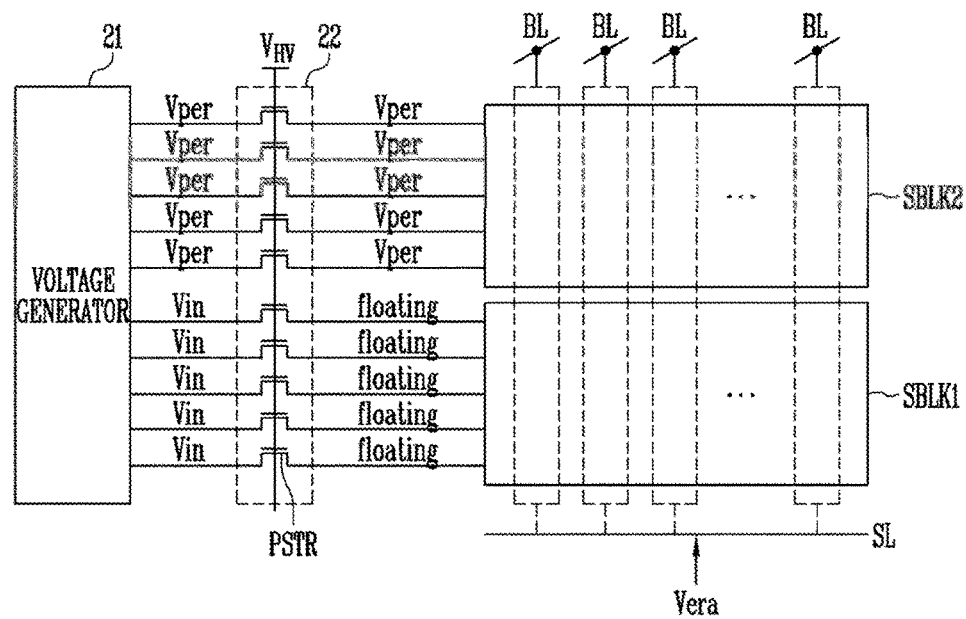
FIG. 11 illustrates voltages applied to word lines coupled to selected sub-blocks and unselected sub-blocks.

FIG. 11 illustrates voltages applied to word lines coupled to a selected sub-block and an unselected sub-block.

Referring to FIG. 11, an example in which the second sub-block SBLK2 is a selected sub-block is described below.

The voltage generator 21 may generate the erase permission voltage Vper and the erase inhibition voltage Vin. The voltage generator 21 may apply the erase permission voltage Vper to global word lines corresponding to the second sub-block SBLK2, and apply the erase inhibition voltage Vin to global word lines corresponding to the first sub-block SBLK1. In addition, the erase voltage Vera generated by the voltage generator 21 may be applied to the source line SL which may be coupled to the selected sub-block SBLK2.

The row decoder 22 may include pass switches PSTR which are turned on or off at the same time in response to a high voltage VHV. The pass switches PSTR may be embodied as high-voltage transistors coupled between the global word lines coupled to the voltage generator 21 and the local word lines coupled to the first and second sub-blocks SBLK1 and SBLK2. FIG. 11 illustrates voltages applied to a selected sub-block and an unselected sub-block. Thus, the connection relationship between the global source selection lines and the global drain selection lines and between local source lines and local drain selection lines are not illustrated.

The erase permission voltage Vper generated by the voltage generator 21 may be set between 0V and 3V, and the erase inhibition voltage Vin may be a positive voltage. More specifically, the erase inhibition voltage Vin may be a positive voltage which is greater than threshold voltages of the pass switches PSTR. Therefore, when the high voltage VHV is applied to the pass switches PSTR, the pass switches PSTR corresponding to the first sub-block SBLK1 and the second sub-block SBLK2 may be turned on. Since the erase permission voltage Vper is less than the threshold voltages of the pass switches PSTR, the erase permission voltage Vper may be applied to the local word lines coupled to the second sub-block SBLK2. In other words, the local word lines coupled to the second sub-block SBLK2 may have a potential between 0V and 3V.

Since the erase inhibition voltage Vin is greater than the threshold voltages of the pass switches PSTR, the potential of the local word lines coupled to the first sub-block SBLK1 may gradually increase. When the potential of the local word lines reaches the erase inhibition voltage Vin, the pass switches PSTR corresponding to the first sub-block SBLK1 may be turned off, so that all local word lines coupled to the unselected first sub-block SBLK1 may be floated. Further, local word lines for the selected second sub-block SBLK2 are not floated.

As described above, since the potential of the local word lines coupled to the first sub-block SBLK1 and the second sub-block SBLK2, respectively, are changed, respective erase operations of the first sub-block SBLK1 and the second sub-block SBLK2 may be performed.

Figure 12:
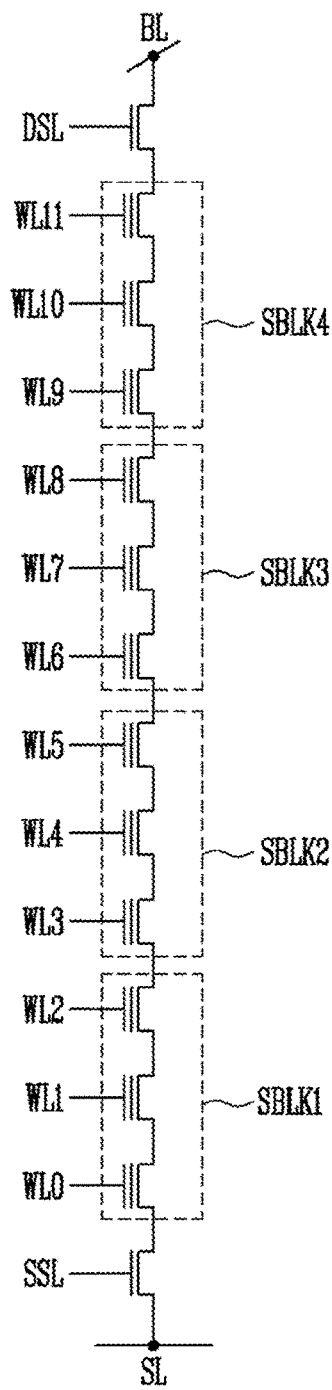
FIG. 12 is a circuit diagram configured to perform an erase operation according another embodiment.

FIG. 12 is a circuit diagram illustrating an erase operation according to another embodiment.

Referring to FIG. 12, vertical strings may be divided into four sub-blocks, and erase operations may be performed thereon. For example, memory cells may be divided into first to fourth sub-blocks SBLK1 to SBLK4 according to the order in which the memory cells are closer to the source selection line SSL. As described above, when a main block includes the first to fourth sub-blocks SBLK1 to SBLK4, and a program operation is performed in a direction from the drain selection transistor DST to the source selection transistor SST, the erase operation may be performed in the reverse order to the program order.

For example, an erase operation of the selected main block may be performed in order from the first sub-block SBLK1 to the fourth sub-block SBLK4. When the first and second sub-blocks SBLK1 and SBLK2 are in an erased state and the third and fourth sub-blocks SBLK3 and SBLK4 are in a programmed state, an erase operation of the selected main block may be performed first on the third sub-block SBLK3 and then on the fourth sub-block SBLK4. As described above, according to a method of determining an erased/programmed state of the first and second sub-blocks SBLK1 and SBLK2, the erased/programmed state information stored in the sub-block information storage unit 131 shown in FIG. 2 may be used to select a sub-block to erase, or erased sub-blocks may be determined by performing a verify operation.

When the third sub-block SBLK3 is determined as a sub-block to be erased, an erase operation of the third sub-block SBLK3 may be performed. When the erase operation of the third sub-block SBLK3 is completed, the erase operation of the fourth sub-block SBLK4 may be performed.

Among the above-described operations, an erase operation performed to determine erased sub-blocks by performing a verify operation is described below in more detail.

Figure 13:
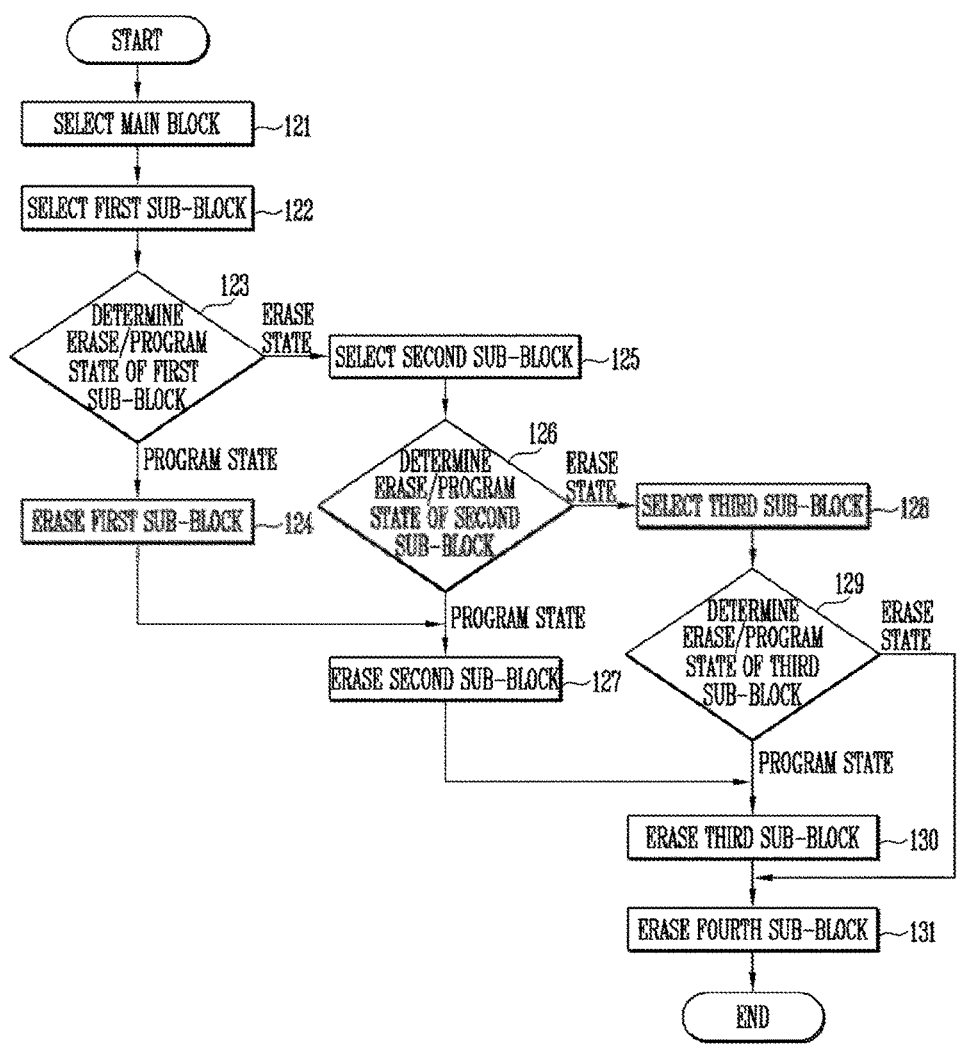
FIG. 13 is a flowchart illustrating an embodiment of an erase operation shown in FIG. 12.

FIG. 13 is a flowchart illustrating an embodiment of an erase operation shown in FIG. 12.

Referring to FIG. 13, a main block on which an erase operation is performed may be selected in response to an erase command (121). Subsequently, a first sub-block included in the selected main block may be selected (122), and an erased/programmed state of the first sub-block may be determined (123). A verify operation may be performed to determine the erased/programmed state of the first sub-block.

When the first sub-block is determined to be in a programmed state, erase operations (124, 127, 130 and 131) of the first to fourth sub-blocks may be performed in a sequential manner.

When the first sub-block is determined to be in an erased state, the first sub-block may not have to be erased again. Thus, a second sub-block may be selected (125), and an erased/programmed state of the second sub-block may be determined (126). A verify operation may be performed to determine the erased/programmed state of the second sub-block.

When the second sub-block is determined to be in the programmed state, erase operations (127, 130 and 131) of the second to fourth sub-blocks may be sequentially performed.

When the second sub-block is determined to be in the erased state, the second sub-block may not have to be erased again. Therefore, the third sub-block may be selected (128), and an erased/programmed state of the third sub-block may be determined (129). A verify operation may be performed to determine the erased/programmed state of the third sub-block.

When the third sub-block is determined to be in the programmed state, erase operations (130 and 131) of the third and fourth sub-blocks may be sequentially performed.

When the third sub-block is determined to be in an erased state, the third sub-block may not have to be erased again. Thus, an erase operation (131) of the fourth sub-block may be performed. During the erase operation of the fourth sub-block (i.e., the last sub-block), a verify operation to determine an erased/programmed state of the fourth sub-block may be omitted.

When the erase operation (131) of the fourth sub-block is completed, the erase operation of the selected main block may be completed.

Figure 14:
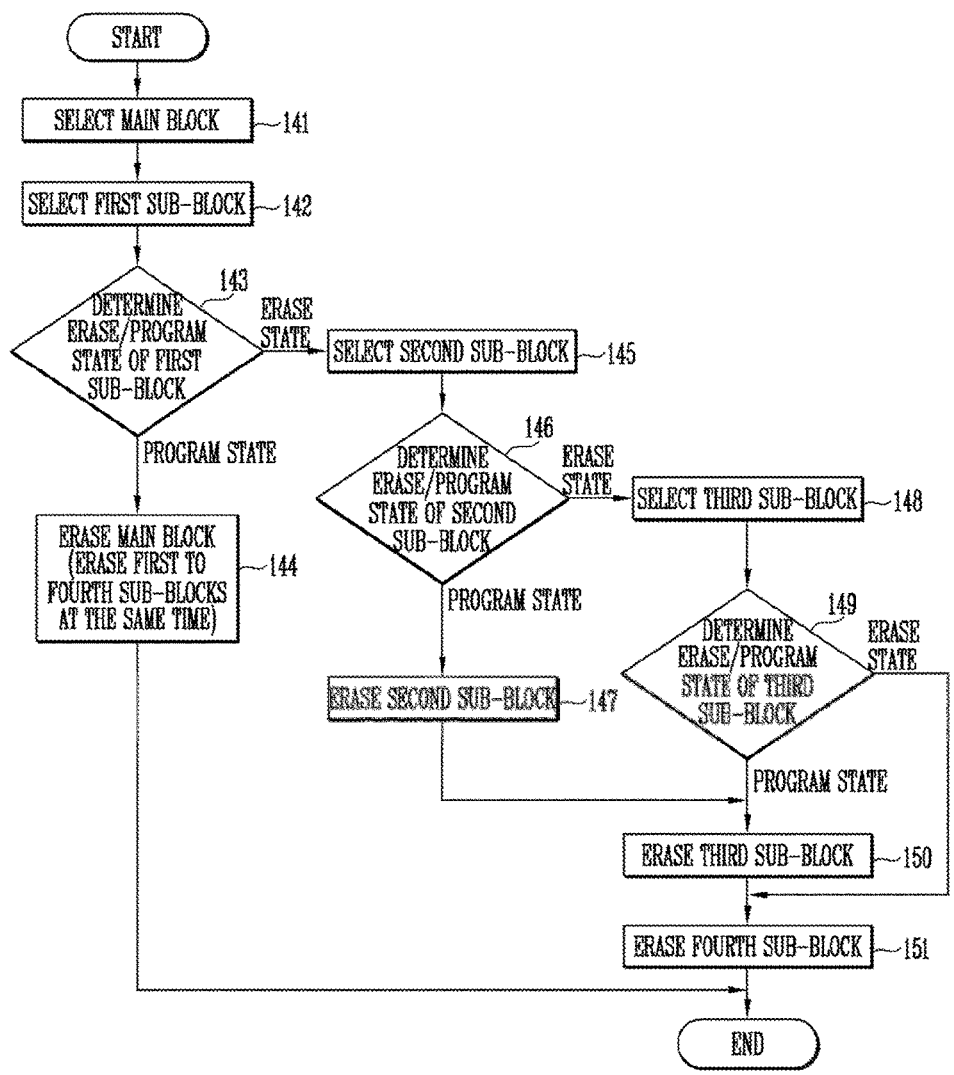
FIG. 14 is a flowchart illustrating another embodiment of an erase operation shown in FIG. 13.

FIG. 14 is a flowchart illustrating another embodiment of an erase operation shown in FIG. 13.

Referring to FIG. 14, a main block on which an erase operation is performed may be selected according to an erase command (141). Subsequently, a first sub-block included in the selected main block may be selected (142), and an erased/programmed state of the first sub-block may be determined (143). A verify operation may be performed to determine the erased/programmed state of the first sub-block.

When the first sub-block is determined to be in a programmed state, an erase operation of the selected main block may be performed (144). To reduce the time taken to perform the erase operation, erase operations of the first to fourth sub-blocks included in the selected main block may be performed at the same time.

When the first sub-block is determined to be in an erased state, the first sub-block may not have to be erased again. Thus, the second sub-block may be selected (145), and an erased/programmed state of the second sub-block may be determined (146). A verify operation may be performed to determine the erased/programmed state of the second sub-block.

When the second sub-block is determined to be in the programmed state, erase operations (147, 150 and 151) of the second to fourth sub-blocks may be sequentially performed.

When the second sub-block is determined to be in an erased state, the second sub-block may not have to be erased again. Thus, the third sub-block may be selected (148), and an erased/programmed state of the third sub-block may be determined (149). A verify operation may be performed to determine the erased/programmed state of the third sub-block.

When the third sub-block is determined to be in the programmed state, erase operations (150 and 151) of the third and fourth sub-blocks may be sequentially performed.

When the third sub-block is determined to be in the erased state, the third sub-block may not have to be erased again. Therefore, the erase operation (151) of the fourth sub-block may be performed. During the erase operation of the fourth sub-block (i.e., the last sub-block), a verify operation performed to determine an erased/programmed state of the fourth sub-block may be omitted.

When the erase operation (151) of the fourth sub-block is completed, the erase operation of the selected main block may be completed.

Figure 15:
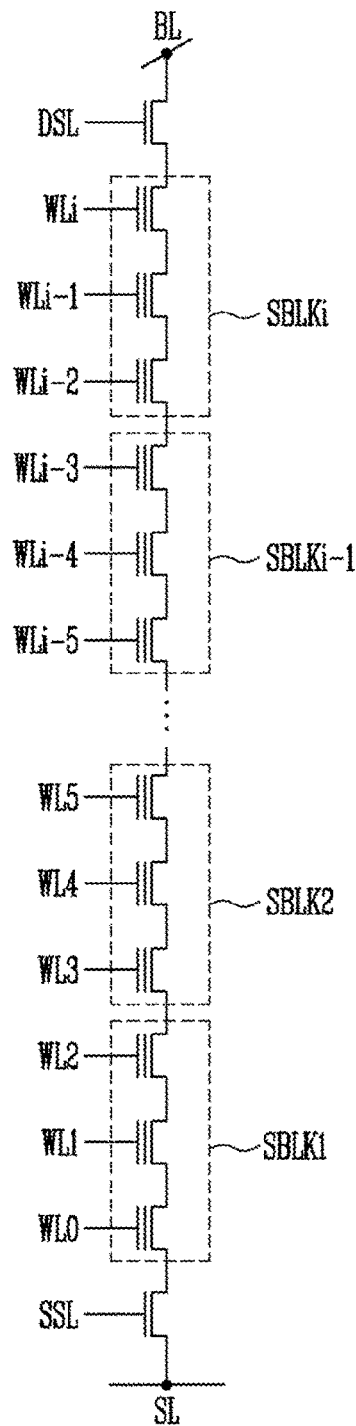
FIG. 15 is a circuit diagram configured to perform another embodiment of an erase operation shown in FIG. 12.

FIG. 15 is a circuit diagram illustrating another embodiment of an erase operation shown in FIG. 12.

Referring to FIG. 15, when vertical strings include many memory cells, a main block may include a plurality of sub-blocks SBLK1 to SBLKi. Even when there are a large number of sub-blocks SBLK1 to SBLKi, erase operations may be performed in the reverse order to the program order. For example, when the program operation is performed in a direction from the drain selection line DSL to the source selection line SSL, erase operations may be performed in order from the first sub-block SBLK1 adjacent to the source selection line SSL to an ith sub-block SBLKi adjacent to the drain selection line DSL. When the first sub-block SBLK1 is an erased state, and the remaining second to ith sub-blocks SBLK2 to SBLKi are in a programmed state, an erased/programmed state of the first sub-block SBLK1 may be determined as described above with reference to FIG. 12. When the second to ith sub-blocks SBLK2 to SBLKi are in an erased state, an erased/programmed state of the second sub-block SBLK2 may be determined. Since the second sub-block SBLK2 is in the programmed state, the erase operation may be performed sequentially from the second sub-block SBLK2 to the ith sub-block SBLKi.

Figure 16:
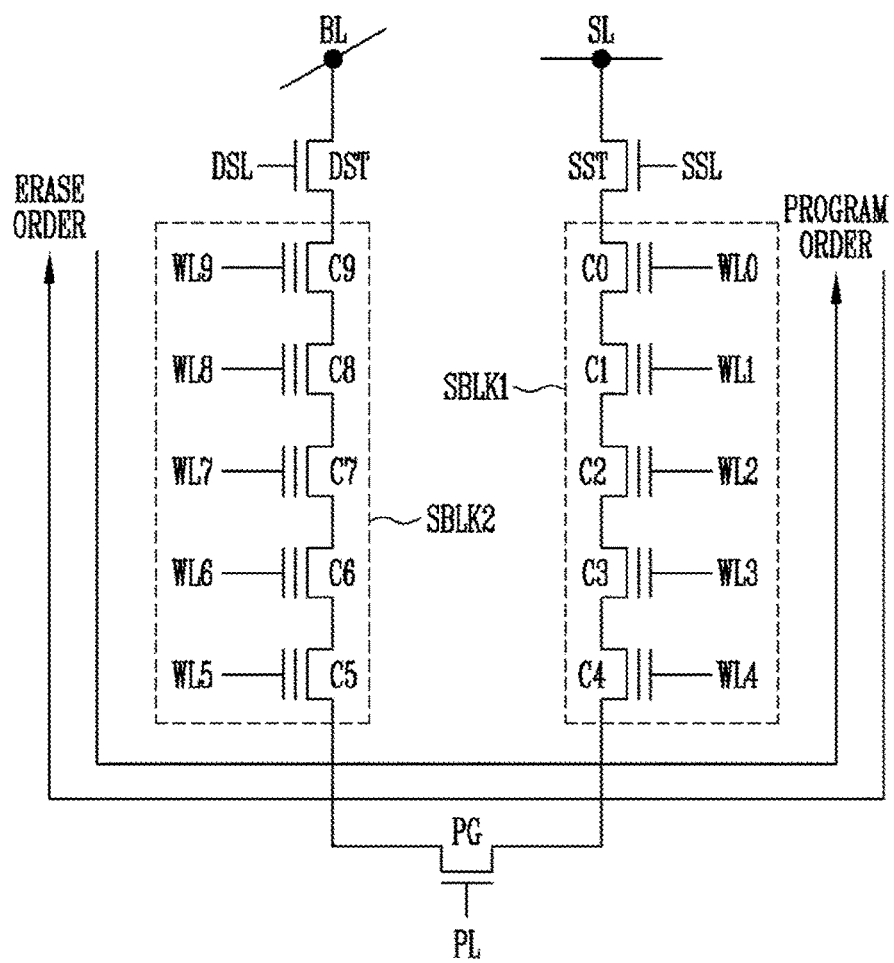
FIG. 16 is a circuit diagram configured to perform an erase operation according to another embodiment.

FIG. 16 is a circuit diagram illustrating an erase operation according to another embodiment. An erase operation of a storage device including vertical strings having a P-BiCS structure is exemplified below.

Referring to FIG. 16, in the vertical string having the P-BiCS structure, memory cells C0 to C4 may be arranged between the source line SL and the pipe line PL, and memory cells C5 to C9 may be arranged between the pipe line PL and the bit line BL. The pipe line PL may be coupled to a gate of a pipe transistor PG. A group of memory cells C0 to C4 arranged in a direction of the source selection line SSL based on the pipe line PL may be designated as the first sub-block SBLK1, and a group of memory cells C5 to C9 arranged in a direction of the bit line BL may be designated as the second sub-block SBLK2.

More specifically, the first sub-block SBLK1 may be stacked on top of the pipe line PL and include the fourth to zeroth memory cells C4 to C0 respectively coupled to the fourth to first word lines WL4 to WL1. The source selection line SSL may be stacked over the zeroth word line WL0 formed on the top of the first sub-block SBLK1, and the source selection transistor SST may be coupled to the source selection line SSL. The source line SL may be coupled to a source of the source selection transistor SST, and the zeroth memory cell C0 may be coupled to a drain of the source selection transistor SST. The second sub-block SBLK2 may include the fifth to ninth memory cells C5 to C9 which are stacked over the pipe line PL and respectively coupled to the fifth to ninth word lines WL5 to WL9. The drain selection line DSL may be stacked over the ninth word line WL9 formed on the top of the second sub-block SBLK2, and the drain selection transistor DST may be coupled to the drain selection line DSL. The bit line BL may be coupled to a drain of the drain selection transistor DST, and the ninth memory cell C9 may be coupled to a source of the drain selection transistor DST. For convenience of explanation, FIG. 16 briefly illustrates a vertical string. However, the number of source selection transistors SST, zeroth to ninth memory cells C0 to C9 and drain selection transistors DST may increase depending on the storage device.

When program operations are performed in a direction from the drain selection transistor DST to the source selection transistor SST, the erase operation may be performed in the reverse order to the program operations. So, the erase operation may be performed in a direction from the source selection transistor SST to the drain selection transistor DST. Program operations may be performed in page units, whereas erase operations may be performed in sub-block units. In other words, erase operations may be performed first on the first sub-block SBLK1 adjacent to the source selection transistor SST, and then on the second sub-block SBLK2 adjacent to the drain selection transistor DST. However, when it is determined that the first sub-block SBLK1 is already in the erase state, the erase operation of the first sub-block SBLK1 may be omitted, and an erase operation of the second sub-block SBLK2 may be performed. The erased/programmed state of the first sub-block SBLK1 may be determined by selecting a sub-block in a programmed state according to the erased/programmed state information about the sub-blocks stored in the sub-block information storage unit 131 shown in FIG. 2, or by verifying the sub-blocks to determine an erased state or a programmed state thereof as described above with reference to FIG. 7.

Figure 17:
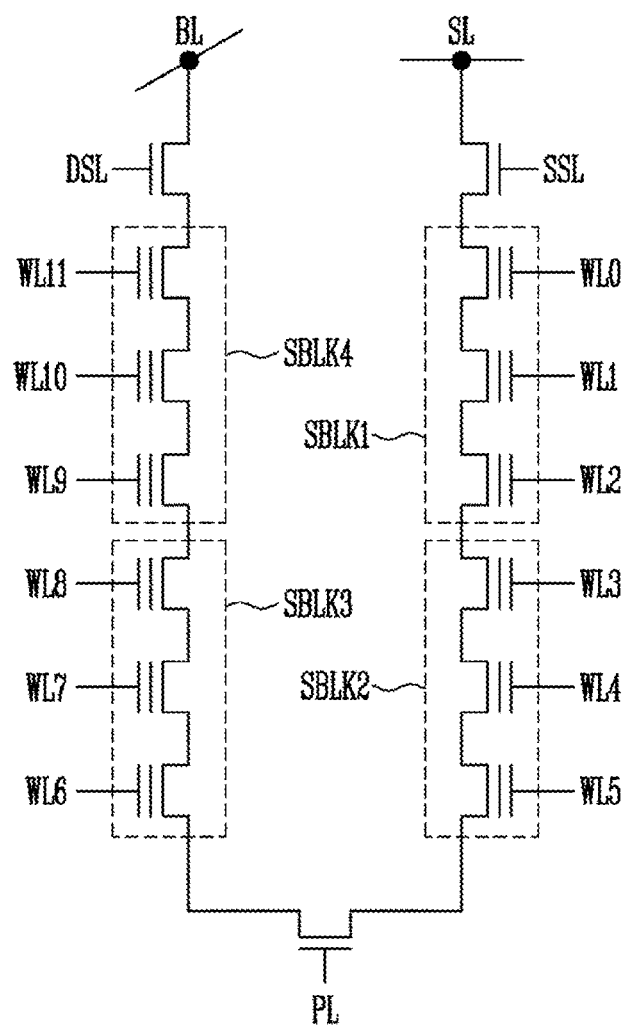
FIG. 17 is a circuit diagram configured to perform an erase operation according to another embodiment.

FIG. 17 is a circuit diagram illustrating an erase operation according to another embodiment.

Referring to FIG. 17, a vertical string having a similar structure to the above-described P-BiCS structure as shown in FIG. 16 may be divided into four sub-blocks SBLK1 to SBLK4. For example, the first sub-block SBLK1 may include memory cells coupled to the zeroth to second word lines WL0 to WL2 adjacent to a lower portion of the source selection line SSL. The second sub-block SBLK2 may include memory cells coupled to the third to fifth word lines WL3 to WL5 adjacent to a lower portion of the second word line WL2. The third sub-block SBLK3 may include memory cells coupled to the sixth to eighth word lines WL6 to WL8 adjacent to an upper portion of the pipe line PL. The fourth sub-block SBLK4 may include memory cells coupled to the ninth to eleventh word lines WL9 to WL11 adjacent to an upper portion of the eighth word line WL8. The number of memory cells included in the vertical string may increase depending on the storage device size. In addition, the number of memory cells included in the first to fourth sub-blocks SBLK1 to SBLK4 may also increase depending on the storage device size.

When the program operation of the selected main block is performed in a direction from the drain selection line DSL to the source selection line SSL, the erase operation of the selected main block may be sequentially performed in a direction from the first sub-block SBLK1 to the fourth sub-block SBLK4 in the reverse order as compared to the program order. When the first and second sub-blocks SBLK1 and SBLK2 are in the erased state and the third and fourth sub-blocks SBLK3 and SBLK4 are in the programmed state, an erase operation of the selected main block may be performed first on the third sub-block SBLK3 and then on the fourth sub-block SBLK4. As described above, the erased/programmed state of the first and second sub-blocks SBLK1 and SBLK2 may be determined by selecting a sub-block to be erased by using the erased/programmed state information stored in the sub-block information storage unit (131 shown in FIG. 2), or by performing a verify operation to determine the erased sub-blocks.

Figure 18:
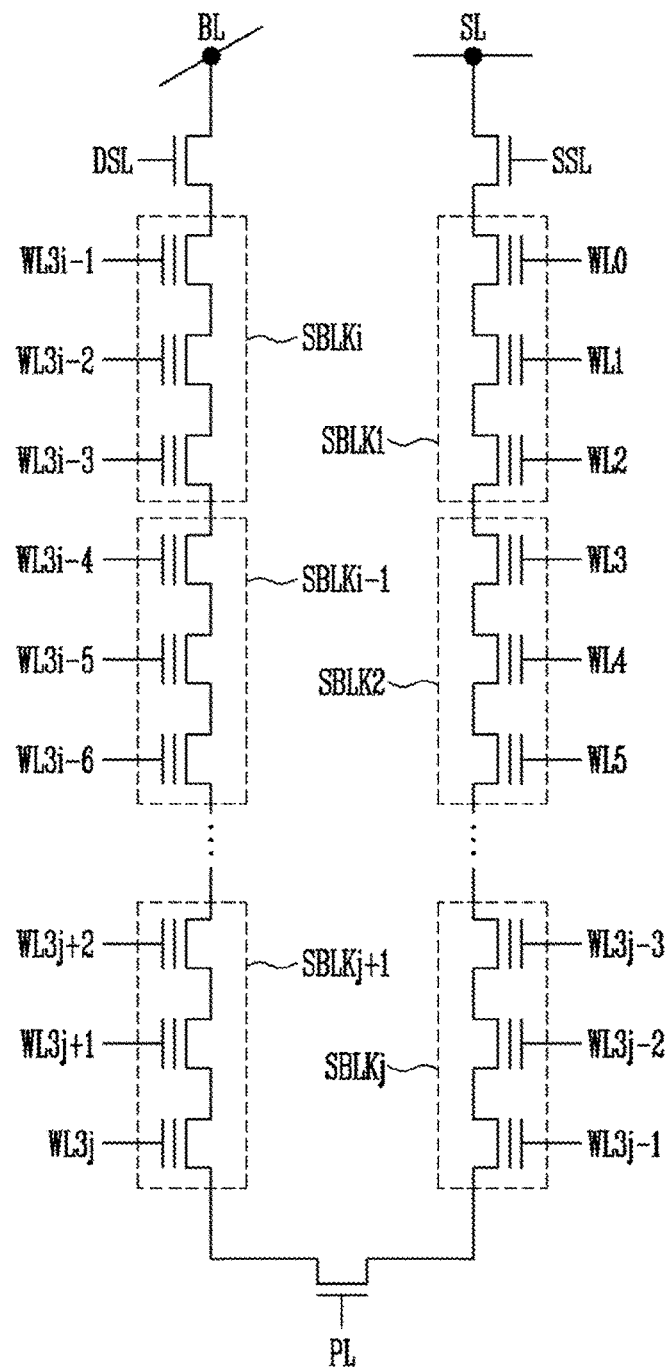
FIG. 18 is a circuit diagram configured to perform an erase operation according to another embodiment.

FIG. 18 is a circuit diagram illustrating an erase operation according to another embodiment.

Referring to FIG. 18, in the structure shown in FIG. 17, when vertical strings include many memory cells, a main block may include a plurality of sub-blocks SBLK1 to SBLKi. Even when there are a large number of the sub-blocks SBLK1 to SBLKi, erase operations may be performed in an order reverse to program operations. For example, when program operations are performed in a direction from the drain selection line DSL to the source selection line SSL, erase operations may be performed in a direction from the first sub-block SBLK1 adjacent to the source selection line SSL to the ith sub-block SBLKi adjacent to the drain selection line DSL. When the first sub-block SBLK1 is in the erased state and the remaining second to ith sub-blocks SBLK2 to SBLKi are in the programmed state, as described above with reference to FIG. 12, it may be determined that the first sub-block SBLK1 is in the erased state by performing an operation to determine an erased/programmed state of the first sub-block SBLK1, and it may be determined that the second sub-block SBLK2 is in the programmed state by determining an erased/programmed state of the second sub-block SBLK2. When the second sub-block SBLK2 is determined to be in the programmed state, erase operations may be sequentially performed in a direction from the second sub-block SBLK2 to the ith sub-block SBLKi.

According to embodiments, a threshold voltage distribution of memory cells of a three-dimensional storage device may be improved to thereby improve reliability of the storage device.

According to embodiments, since flag cells in which erased/programmed information of sub-blocks are not required, a size of the storage device may be reduced.

Figure 19:
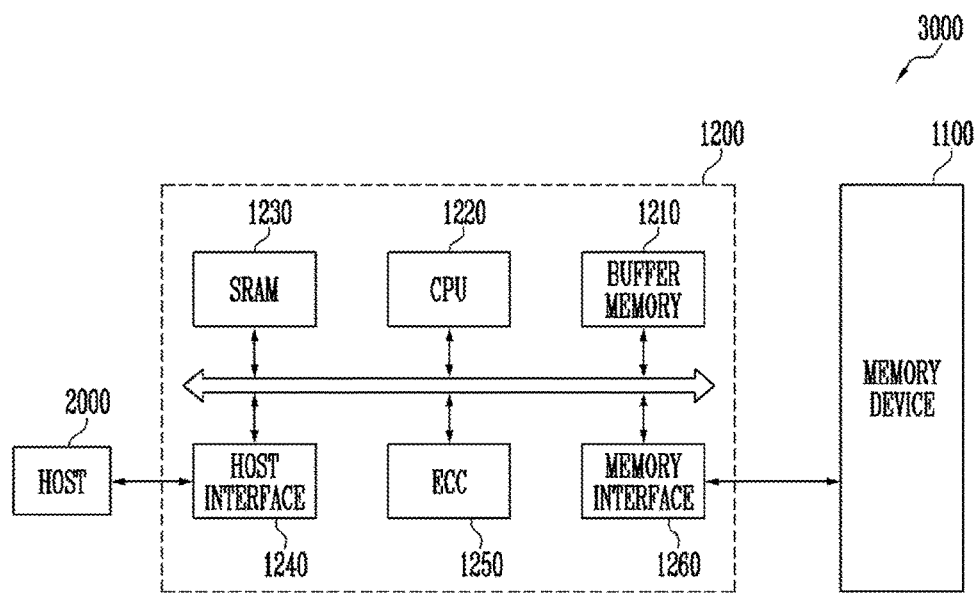
FIG. 19 illustrates a memory system according to an embodiment.

FIG. 19 is a block diagram illustrating a memory system 3000 according to an embodiment of the present disclosure.

Referring to FIG. 19, a memory system 3000 may include a memory device 1100 storing data therein and a memory controller 1200 controlling the memory device 1100. In addition, the memory controller 1200 may control communication between the host 2000 and the memory device 1000. The memory controller 1200 may include a buffer memory 1210, a CPU 1220, SRAM 1230, a host interface 1240, ECC 1250 and a memory interface 1260.

The buffer memory 1210 may temporarily store data when the memory controller 1200 controls the memory device 1100. The CPU 1220 may perform a control operation for a data exchange of the memory controller 1200. The SRAM 1230 may be used as a working memory. The host interface 1240 may include a data exchange protocol of the host 2000 being coupled to the memory system 3000. The ECC 1250 may be an error correction unit that detects and corrects errors included in data read from the memory device 1100. The memory interface 1260 may interface with the memory device 1110. Though not shown in FIG. 19, the memory system 3000 may further include ROM (not illustrated) that stores code data to interface with the host 2000.

The host 2000 in which the memory system 3000 according to an embodiment is used may include one of various components of an electronic device, such as a computer, an ultra-mobile PC (UMPC), a workstation, a net-book, personal digital assistants (PDAs), a portable computer, a web tablet, a wireless phone, a mobile phone, a smart phone, an e-book, a portable multimedia player (PMP), a portable game machine, a navigation device, a black box, a digital camera, a three-dimensional (3D) television, a digital audio recorder, a digital audio player, a digital picture recorder, a digital picture player, a digital video recorder, a digital video player, a device for transmitting/receiving information in wireless environments, and one of various electronic devices for home networks.

Figure 20:
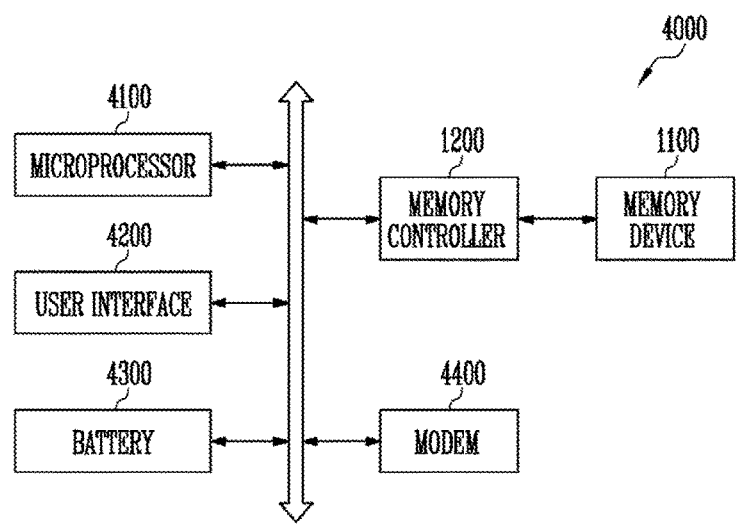
FIG. 20 illustrates the schematic configuration of a computing system including a memory system according to an embodiment.

FIG. 20 illustrates a schematic configuration of a computing system including a memory system 4000 according to an embodiment.

Referring to FIG. 20, the memory system 4000 according to an embodiment may include the memory device 1110, the memory controller 1200, a microprocessor 4100, a user interface 4200 and a modem 4400. In addition, when the memory system 4000 is a mobile device, a battery 4300 may be additionally included to supply an operating voltage to the memory system 4000. Though not shown in FIG. 20, the memory system 4000 according to an embodiment may further include an application chip set, a camera image processor (CIS), a mobile Dram (not shown), and the like.

The memory system 4000 according to an embodiment may be mounted using various types of packages. For example, the memory system 4000 according to an embodiment may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), wafer-level processed stack package (WSP), and the like.

According to an embodiment, a threshold voltage distribution of memory cells of a three-dimensional storage device may be improved, thereby improving reliability of the storage device.

According to an embodiment, flag cells storing erased/programmed information about sub-blocks are not necessary, thereby reducing the size of the storage device.

What is claimed is:

1. A storage device, comprising:
   a main block including a plurality of sub-blocks;
   a peripheral circuit configured to perform a program operation, a read operation or an erase operation on the sub-blocks; and
   a control logic configured to control the peripheral circuit so that the erase operation of the sub-blocks is performed in a reverse direction to a direction of the program operation.

2. The storage device of claim 1, wherein memory cells included in the main block are grouped in sub-block units.

3. The storage device of claim 1, wherein the control logic controls the peripheral circuit so that the program operation is performed in page units in the main block and the erase operation is performed in sub-block units.

4. The storage device of claim 1, wherein the control logic controls the peripheral circuit so that when the program operation of the main block is performed in a direction from a drain selection line to a source selection line, the erase operation is performed on the sub-blocks in a direction from a sub-block adjacent to the source selection line to a sub-block adjacent to the drain selection line, and the control logic controls the peripheral circuit so that when the program operation of the main block is performed in a direction from the source selection line to the drain selection line, the erase operation is performed in a direction from the sub-block adjacent to the drain selection line to the sub-block adjacent to the source selection line.

5. A method of operating a storage device, the method comprising:

programming sub-blocks included in a selected main block; and erasing the sub-blocks in a reverse direction to a direction of programming of the sub-blocks.

6. The method of claim 5, wherein in the programming of the sub-blocks, the sub-blocks are sequentially or randomly selected, and programmed.

7. The method of claim 5, wherein the programming of the sub-blocks is performed in page units included in the sub-blocks, and the erasing of the sub-blocks is performed in sub-block.

8. The method of claim 5, wherein the erasing of the sub-blocks comprises:

determining an erased/programmed state of a selected sub-block; and erasing the sub-blocks or determining an erased/programmed state of a next sub-block according to a result of a determination.

9. The method of claim 8, further comprising performing an erase operation in a direction from the selected sub-block in a reverse order to the programming of the sub-blocks when, as the result of the determination, it is determined that the selected sub-block is in the program state.

10. The method of claim 8, further comprising determining the erased/programmed state of the next sub-block when, as the result of the determination, the selected sub-block is determined to be in the erase state.

11. The method of claim 8, wherein the determining of the erased/programmed state of the selected sub-block uses sub-block information stored in a sub-block information storage included in a control logic, or a verify operation of the selected sub-block.

12. The method of claim 11, wherein the sub-block information includes information about a sub-block in the erase state or information about a sub-block in the program state, among the sub-blocks included in the selected main block.

13. The method of claim 12, wherein an erase operation starts to be performed on a sub-block subsequent to the sub-blocks in the erase state when the sub-block information corresponds to information about the sub-blocks in the erase state.

14. The method of claim 12, wherein an erase operation starts to be performed on a first sub-block according to order of the erase operation, among the sub-blocks in the program state.

15. The method of claim 11, wherein threshold voltages of memory cells included in the selected sub-block are less than an erase verify voltage or a read voltage when a verify operation of the selected sub-block is used.

16. The method of claim 15, wherein when the threshold voltages are less than the erase verify voltage or the read voltage, the selected sub-block is determined to be in the erase state, and a next sub-block is selected, and the erase operation starts to be performed on the selected sub-block when the threshold voltages are greater than the erase verify voltage or the read voltage.

17. The method of claim 16, wherein the verify operation of the selected sub-block is omitted and the selected sub-block is erased when the selected sub-block is a last sub-block, among the sub-blocks included in the main block.

18. The method of claim 15, wherein the erase verify voltage is set to a range between −0.5V and +1V, or the read voltage is set to a range between −1V and a positive voltage.

19. The method of claim 18, wherein the positive voltage is a lowest voltage in a threshold voltage distribution in the program state.

20. The method of claim 8, wherein the erasing of the sub-blocks after the determining of the erased/programmed state of the selected sub-block comprises:

applying an erase voltage to a source line coupled to the selected sub-block;

applying an erase permission voltage to local word lines coupled to the selected sub-block, and floating local word lines coupled to unselected sub-blocks except for the selected sub-block.

* * * * *